(12) United States Patent
Park et al.

(10) Patent No.: US 6,534,385 B2
(45) Date of Patent: Mar. 18, 2003

(54) METHOD OF FUSION FOR HETEROEPITAXIAL LAYERS AND OVERGROWTH THEREON

(75) Inventors: Young-Ju Park, Seoul (KR); Sung-Min Hwang, Seoul (KR); Eun-Kyu Kim, Seoul (KR)

(73) Assignee: Korea Institute of Science and Technology, Korea (KR)

( * ) Notice: Subject to any disclaimer, the term of this patent is extended or adjusted under 35 U.S.C. 154(b) by 0 days.

(21) Appl. No.: 10/003,999

(22) Filed: Nov. 14, 2001

(65) Prior Publication Data

US 2002/0086494 A1 Jul. 4, 2002

(30) Foreign Application Priority Data

Dec. 28, 2000 (KR) ......................... 2000-83712

(51) Int. Cl.⁷ .......................... H01L 21/30; H01L 21/46
(52) U.S. Cl. ...................................... 438/459
(58) Field of Search ................... 438/459, 455, 438/406

(56) References Cited

U.S. PATENT DOCUMENTS

| 5,040,032 A | * | 8/1991 | Kapon | 257/14 |
| 5,827,754 A | * | 10/1998 | Min et al. | 438/40 |
| 5,904,492 A | * | 5/1999 | Min et al. | 438/42 |
| 5,985,687 A | * | 11/1999 | Bowers et al. | 438/46 |
| 6,205,165 B1 | * | 3/2001 | Yamamoto et al. | 372/96 |
| 6,285,698 B1 | * | 9/2001 | Romano et al. | 372/46 |
| 6,323,108 B1 | * | 11/2001 | Kub et al. | 438/458 |

OTHER PUBLICATIONS

*Journal of Crystal Growth*, ScienceDirect, vol. 220, Issues 1–2, pp. 1–4.

Hwang et al. Growth Behavior of GaAs/AlGaAs Multi-Layers Grown on U–Grooved GaAs Fusion Layer on InP Substrate; *Journal of Crystal Growth*, vol. 220 (2000), pp. 56–61.

* cited by examiner

*Primary Examiner*—Carl Whitehead, Jr.
*Assistant Examiner*—William C. Vesperman
(74) *Attorney, Agent, or Firm*—Pennie & Edmonds LLP

(57) ABSTRACT

The present invention relates to a method of fusion for heteroepitaxial layers and overgrowth thereon. According to the present invention, a high quality heteroepilayer can be formed by patterning a fused semiconductor layer, overgrowing it with a persistent patterned character, and fusing other semiconductors having different lattice constants by means of utilizing the rate difference between the lateral growth rate and the vertical growth rate exhibited, on the above process. Further, according to the present invention, the lattice constant difference of the two semiconductors can be overcome and a high quality quantum structure can be formed. According to the present invention, the junction of two semiconductor materials having different lattice constants, as well as a good overgrowth on heteroepitaxial layers can be carried out. Accordingly to the present invention, the base material from which the new, as yet on realized, conceptive optoelectronic device can be made.

3 Claims, 5 Drawing Sheets

METHOD OF FUSION FOR HETEROEPITAXIAL LAYERS AND OVERGROWTH THEREON

BACKGROUND OF THE INVENTION

1. Field of the Invention

The present invention relates to methods of fusion for heteroepitaxial layers and overgrowth thereon. More particularly, the present invention relates to methods of forming a high quality epitaxial layer on the heteroepitaxy with materials having different lattice constants and heteroepitaxy so fabricated.

2. Description of the Prior Art

Generally, it is almost impossible to form a high quality crystal layer with materials having different lattice constants. Forming a thin film on a substrate by using another material having a lattice constant different from that of the substrate causes defects such as threading dislocation inside the thin film, thereby resulting in significant deterioration of crystal and optical properties of the so-formed substrate. For example, it is almost impossible for GaAs having different lattice constants to be grown on a Si substrate or an InP substrate without any defects. However, if defect-free growth can be realized, high integration of optoelectronic devices on a substrate and of various communication and electronic devices can be achieved. Further, innovative development of an optical device and an electronic device will be possible.

There are some prior art methods for heteroepitaxial growth that claim to suppress dislocation growth. Examples of such methods are a two-step growth method, a method introducing a deformation layer, wafer fusion, etc. Wafer fusion, particularly, has many advantages in that it can be applied to various material systems. However, it is difficult for the interface between two substrates to be free of defects due to the effects of the two substrates. As a result, a good quality hetero-junction cannot be achieved.

Recently, devices utilizing quantum structures have been drawing a significant amount of attention. The innovative development of semiconductor fabrication technology in this century provides various technical advancements to humankind. In the 21$^{st}$ century, society will be oriented toward an information super-highway and the main goal of research efforts will be directed toward semiconductor nanofabrication technology, which will make it possible to fabricate highly integrated circuitry of two-dimensional plane and one-dimensional wires. The future of quantum nanostructure devices will strongly rest upon the success of this technology. The quantum well structure was realized experimentally by using a hetero-junction of two types of semiconductor material with different band gaps in the early 1970s. In the 1980s, experiments conducted on quantum wires in which the electrons have one degree of freedom were successful. In the mid-1980s, the fabrication of the quantum dot structure was accomplished, whereby electrons having zero degree of freedom could be investigated. As an application of the quantum process, new conceptive devices such as HEMT (high electron mobility transistor) have been created. Further, novel quantum devices, such as laser diodes, optical couplers, etc., are already commercialized and utilized in CDs, laser printers, etc. In addition, a single electron transistor utilizing a quantum structure is intensively being studied as a possible core device for the future.

In order to form such quantum structures, good quality heteroepitaxial growth must be achieved. However, a hetero-junction of two semiconductor materials with different lattice constants has the problems mentioned above, and nothing has been published on quantum structure-related technology for heteroepitaxy.

3. SUMMARY OF THE INVENTION

The object of the present invention is to provide, without significant defects, methods capable of accomplishing good quality epitaxial growth after the junction of two semiconductor materials having different lattice constants.

The other object of the present invention is to form a good quality quantum well structure by joining said two semiconductor materials.

4. BRIEF DESCRIPTION OF THE DRAWINGS

FIGS. 1$a$ to 1$e$ are schematic diagrams for the fabrication of heteroepitaxial growth according to the present invention.

FIG. 1$a$ is a schematic diagram illustrating a step of forming a sacrificial layer and a fusion layer on a first semiconductor substrate.

FIG. 1$b$ is a schematic diagram illustrating a step of fusing a fusion layer on a second semiconductor substrate.

FIG. 1$c$ is a schematic diagram illustrating a step of separating semiconductor substrates by removing a sacrificial layer.

FIG. 1$d$ is a schematic diagram illustrating a step of patterning a fusion layer.

FIG. 1$e$ is a schematic diagram illustrating a step of overgrowth on a patterned fusion layer.

5. DETAILED DESCRIPTION OF THE INVENTION

Figure 1A:
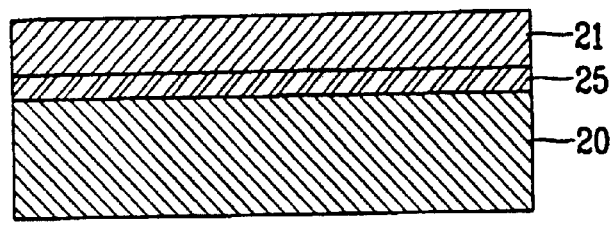
Figure 1B:
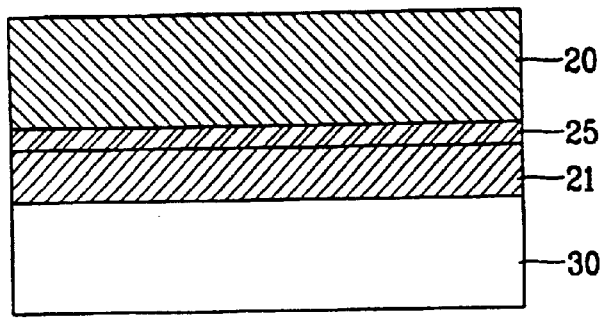
Figure 1C:
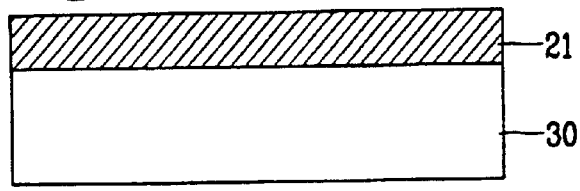

To achieve the above objects, the present invention provides the methods of fusion for heteroepitaxial layers and overgrowth thereon comprising the steps of:

a) forming an epitaxial layer, having a lattice constant similar to that of the first semiconductor substrate, as a sacrificial layer on said first semiconductor substrate;

b) forming an epitaxial layer, consisting of the same material as that of the first semiconductor substrate, as a fusion layer on said sacrificial layer;

c) fusing the fusion layer to a second semiconductor substrate consisting of a material having a lattice constant different from said first semiconductor substrate;

d) separating the first semiconductor substrate from the second semiconductor substrate by removing the sacrificial layer;

e) patterning a U or V shape in the fusion layer; and f) overgrowing multi-layers consisting of materials with a lattice constant that is the same as or similar to that of the fusion layer on the patterned fusion layer.

The first semiconductor substrate and the second semiconductor substrate, both consisting of the group III-V element, may be In$_x$Ga$_{1-x}$As$_y$P$_{1-y}$ and GaAs or In$_x$Ga$_{1-x}$Sb and GaAs, and the first semiconductor substrate, consisting of the group IV element, and the second semiconductor substrate, consisting of the group III-V element, may be $In_xGa_{1-x}As$ and Si; and the first semiconductor substrate and second semiconductor substrate, both consisting of the group IV element, may be $Si_{1-x}Ge_x$ and Si, etc. However, this does not limit the present invention; rather, a combination of various materials is possible in the present invention.

The step c) of fusing the fusion layer on said second semiconductor substrate is carried out by a process comprising:

contacting the surface of the fusion layer with the surface of the second semiconductor substrate;

maintaining said substrates in this state at a temperature of 200–950° C. and a pressure of 0–100 atm under an $H_2$ ambient or vacuum for 10 min. to 5 hours; and lowering the temperature and releasing the pressure.

In considering the decomposition of materials used for a fusion layer and a semiconductor substrate, it is preferable that the fusing temperature be 200–650° C. in an $In_xGa_{1-x}As_yP_{1-y}/GaAs$ or $In_xGa_{1-x}Sb/GaAs$ system, 400–950° C. in an $In_xGa_{1-x}As/Si$ system, and 500–950° C. in a $Si_{1-x}Ge_x/Si$ system.

Further, the present invention provides heteroepitaxial layers comprising: a first semiconductor substrate; a second semiconductor substrate consisting of a material having a different lattice constant from that of said first semiconductor substrate, said second semiconductor substrate being formed on said first semiconductor substrate and whose surface is patterned in a U or V shape; and overgrown multi-layers of a material identical with that of said second semiconductor substrate, said overgrown multi-layers being formed on said second semiconductor substrate and of which a quantum well structure is formed on the top region.

Hereinafter, the present invention will be described by way of illustrative examples with reference to the accompanying drawings.

6. EXAMPLE

In the Example, the epitaxial growth of GaAs on InP and Si substrates having different lattice constants will be illustrated. FIGS. 1a to 1e are schematic diagrams for fabrication of heteroepitaxial growth according to the present invention.

An AlAs layer (25) was grown as a sacrificial layer on the GaAs substrate (20) to 500 Å–5000 Å at 750° C. by the conventional AP-MOCVD (atmospheric pressure metalorganic chemical vapor deposition) technique. A GaAs epilayer (21) was then grown as a fusion layer to about 1500 Å thickness (see FIG. 1a).

Since a large difference in the lattice constant between the first semiconductor substrate and the sacrificial layer causes a lattice relaxation to form line defects, etc., a material in which the lattice constant difference with the first semiconductor is 1% or less is preferably selected for the sacrificial layer. Further, the thickness of the sacrificial layer must be selected from the range in which a lattice relaxation will not occur. The thickness of the fusion layer may depend on the use ends of the fused heteroepitaxial substrate. Further, in contrast with FIG. 1a, it is possible to form a sacrificial layer on an epitaxial layer after forming an epitaxial layer consisting of a material that is identical to the first semiconductor material on the first semiconductor substrate in order to remove the effects of contaminants, etc., on the surface of a first semiconductor substrate.

A GaAs substrate (20), on which the aforementioned sacrificial layer and fusion layer were grown, was fused on a second semiconductor substrate (30) (InP wafer and Si wafer in the Example) with the surface of the latter being contacted with the surface of said fusion layer (21) having a different lattice constant, and then a resulting fused substrate was introduced into a furnace. The pressure of 1–100 atm was applied to the introduced fused substrate, and the $N_2$ gas was then introduced into a furnace with a flow rate of 1000 sccm for about 5 min. The furnace was maintained under $H_2$ ambient or vacuum for 10 min. to 5 hours. When an InP substrate as a second semiconductor substrate was used, the temperature was 400–650° C., and when a Si substrate as a second semiconductor substrate was used, the temperature was 720–950° C. Under such conditions, the two substrates were fused by the diffusion effects that occurred between the group III element (i.e. Ga) comprising a fusion layer, on a first semiconductor substrate and the group V element (i.e., In) comprising a second semiconductor substrate (see FIG. 1b).

In the following step, the two fused substrates were separated. In the Example, a GaAs substrate (20), which is a first semiconductor substrate, was separated from a second semiconductor substrate (30) (see FIG. 1c). Here, an AlAs layer (25) itself, which is a sacrificial layer, can be etched as a etching layer, and a first semiconductor substrate can be separated from the fusion layer fused on the second semiconductor substrate, or only the first semiconductor substrate can be etched as a etch-stop layer on the second semiconductor substrate that is fused with the fusion layer. In the latter case, a sacrificial layer is etched again, and only a second semiconductor substrate and a fusion layer eventually remain.

An example of a method for separating an AlAs layer (25), which is a sacrificial layer, is to remove the AlAs layer by using a mixture of HF and deionized water or a mixture of $NH_4OH$, $H_2O_2$ and deionized water. In cases where a mixture of HF and deionized water is used, the two fused substrates are dipped into the aqueous solution of the mixture for about 12 hours so that only the AlAs layer (25) is etched, thereby resulting in the separation of the two substrates. In cases where a mixture of $NH_4OH$, $H_2O_2$ and deionized water is used, after mounting all remaining regions except for the bottom face (the face on which a sacrificial layer is not formed) of a GaAs substrate (20) that is a first semiconductor substrate, the mounted layers are dipped into the mixture for at least 4 hours. The specimen is then dipped into a mixture of HCl and deionized water or a mixture of HF and deionized water for at least 12 sec. again, thereby resulting in most GaAs substrate (20) being etched and removed. By etching and removing the remains of a sacrificial layer again, only a fusion layer remains.

Figure 1D:
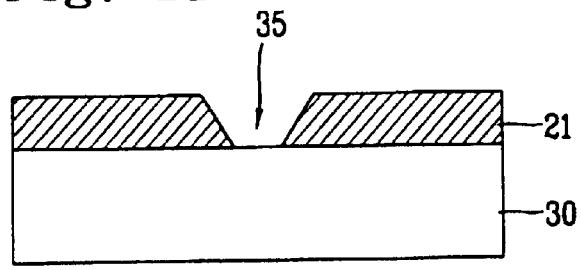

In the following step, part of the fusion layer was patterned and etched by lithography (see FIG. 1d). A mask having a wire pattern or a dot pattern was used, and then a positive or negative photo-resist was subjected to spinning, soft-baking, exposure to a light of an ultraviolet wavelength, and then cleaning with a developing solution the regions with and without photo-resist. The patterned region of a fusion GaAs layer (21) was then etched. The surface of the second semiconductor substrate consists of an area of a substrate (35) and a patterned fusion layer (21) by such patterning. As is illustrated, the cross-section of a fusion layer was patterned as a similar U or V shape.

The pattern of the fusion layer can be formed by electron beam lithography, laser hololithography, or other usual forms of photolithography. However, it is preferable that, in the step e) of patterning on the fusion layer, the cross-section width of the patterned fusion layer ranges from 50 nm–10

μcm. If the width is less than 50 nm, the promoting effect of the lateral growth rate of the overgrowing cannot be obtained; if the width is too wide, a flatted plane cannot be efficiently obtained.

Figure 1E:
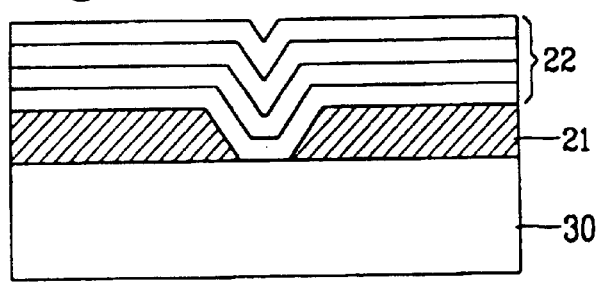

GaAs multi-layers (22) consisting of a material that is the same as a fusion layer were overgrown on a fusion layer (21) patterned as mentioned above and on a second semiconductor substrate (35) by MOCVD or molecular beam epitaxy technique (see FIG. 1e). As can be seen in FIG. 1e, as overgrowing proceeds, the patterned area of the fusion layer decreases since the lateral growth rate is larger than the vertical growth rate. The groove of the small V shape is formed in the center of the top region of the overgrowth layers (22). If the overgrowth proceeds further than that illustrated in FIG. 1e, the groove of the small V shape will vanish. Quantum structures such as quantum wires and dot structures can be fabricated selectively on the top of a fusion layer, which is etched as U or V shape, by means of such an overgrowth. Further, by means of such overgrowth, a good quality semiconductor hetero-junction can be accomplished since a material that is identical to a fusion layer is formed on the area of the substrate (35) illustrated in FIG. 1d by lateral growth while being slightly affected by a second semiconductor substrate.

Figure 2:
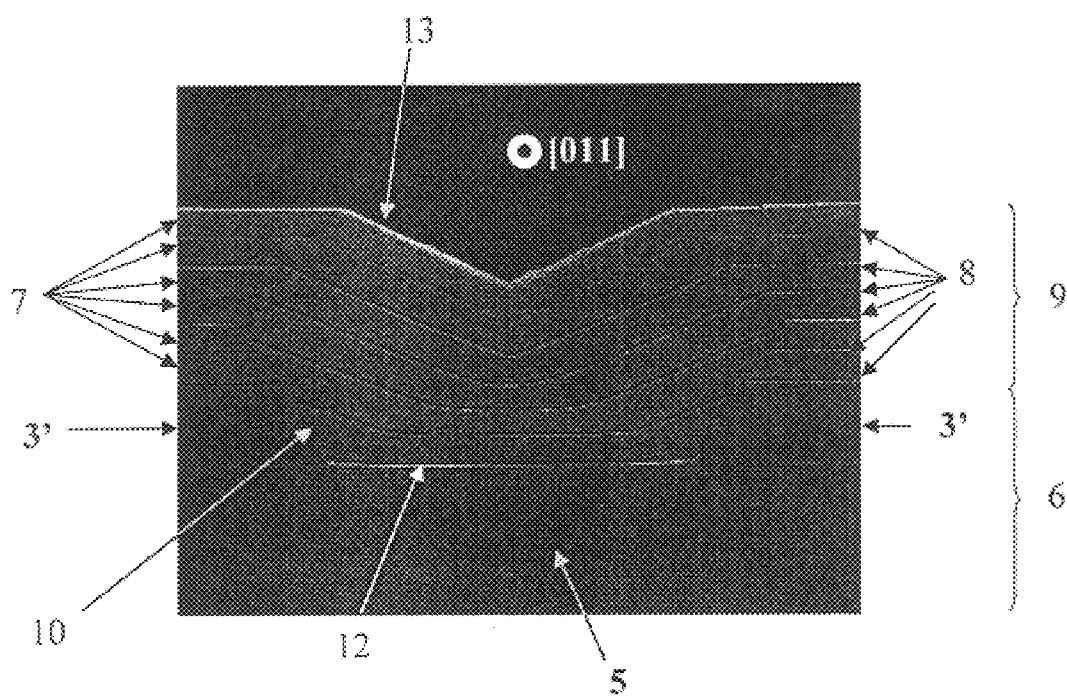
FIG. 2 is a cross-sectional photograph of heteroepitaxial layers formed along the direction of [011] according to the present invention.

FIG. 2 is a cross-sectional photograph of heteroepitaxial layers formed according to the present invention along the direction of [011]. Reference number 6 represents a semiconductor substrate and a fusion layer formed thereon. To distinguish it with multi-layers (9) of a GaAs layer (7) overgrown on a fusion layer (3'), AlGaAs layers (8) were formed alternatively between GaAs layers (7). The etched side-plane (10) of the patterned GaAs fusion layer (3') on the semiconductor substrate (5) was (111)B facet.

Figure 3:
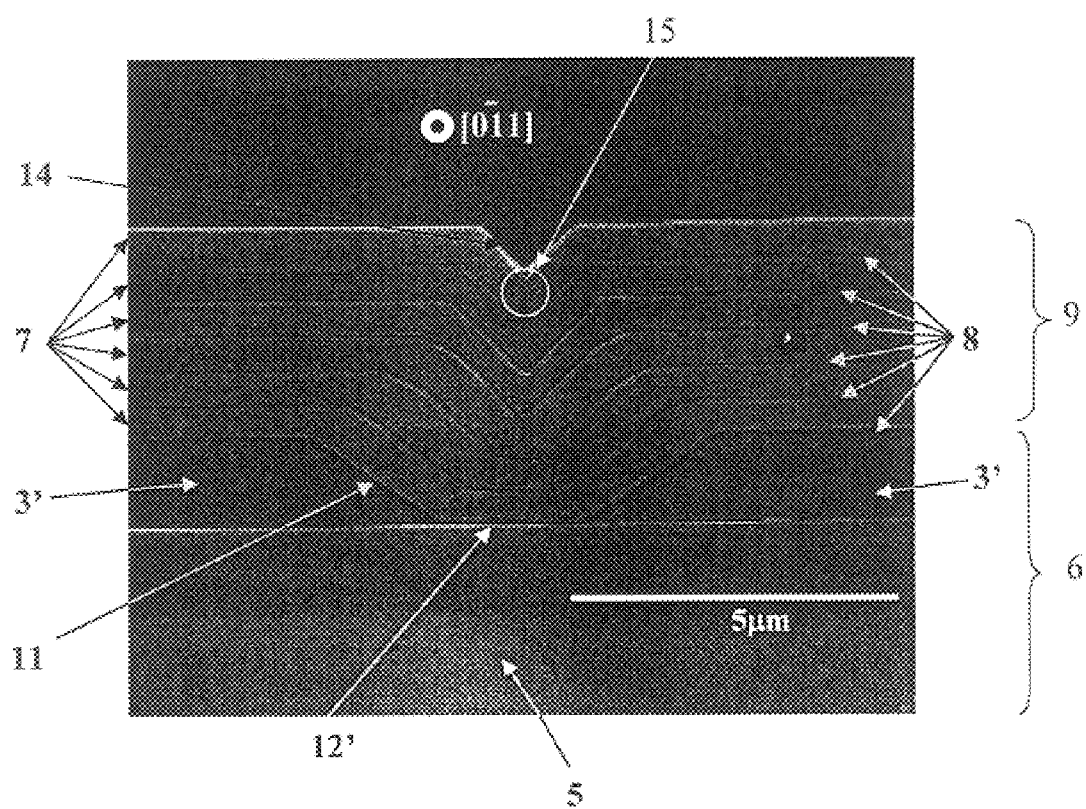
FIG. 3 is a cross-sectional photograph of heteroepitaxial layers shown in FIG. 2 along the direction of [0$\bar{1}$1].

FIG. 3 is a cross-sectional photograph of heteroepitaxial growth shown in FIG. 2 along the direction of [0$\bar{1}$1]. The etched side-plane (11) of the patterned GaAs fusion layer (3') was (211)A along the direction of [0$\bar{1}$1].

As described above, the etched side-plane (10, 11) of the patterned GaAs fusion layer (3') was (111)B and (211)A along the directions [011] and [0$\bar{1}$1], respectively, while the etched side-plane of the patterned layer which is not fused is generally (111)A along the direction of [011] and [0$\bar{1}$1]. Such phenomena are considered to be attributable to a physicochemical transformation of the fused interfaces (12, 12').

On the other hand, the top regions (13, 14) of the GaAs (7)/AlGaAs (8) multi-layers (9) grown on the patterned GaAs fusion layer (3') evolve to (411)B and (433)A along the directions [011] and [0$\bar{1}$1], respectively. This kind of evolution is because the lateral growth rates of GaAs/AlGaAs multi-layers on the patterned GaAs fusion layer (3') are larger than the vertical growth rates of said multi-layers in both directions [011] and [0$\bar{1}$1]. The phenomena are exhibited particularly in the direction [0$\bar{1}$1].

There are several ways to enhance the lateral growth rate, such as the use of carbon dopants, e.g., an organometal compound material for carbon doping such as $CCl_4$ or $CBr_4$. If such phenomena are utilized well, they provide optimal conditions under which a good quality GaAs quantum wire having a lattice constant that is significantly different from that of the InP substrate can be formed on the InP substrate. Further, quantum structures such as quantum dots can be formed depending on the fabrication method. Practically, FIG. 4 is evidence of such a possibility.

Figure 4:
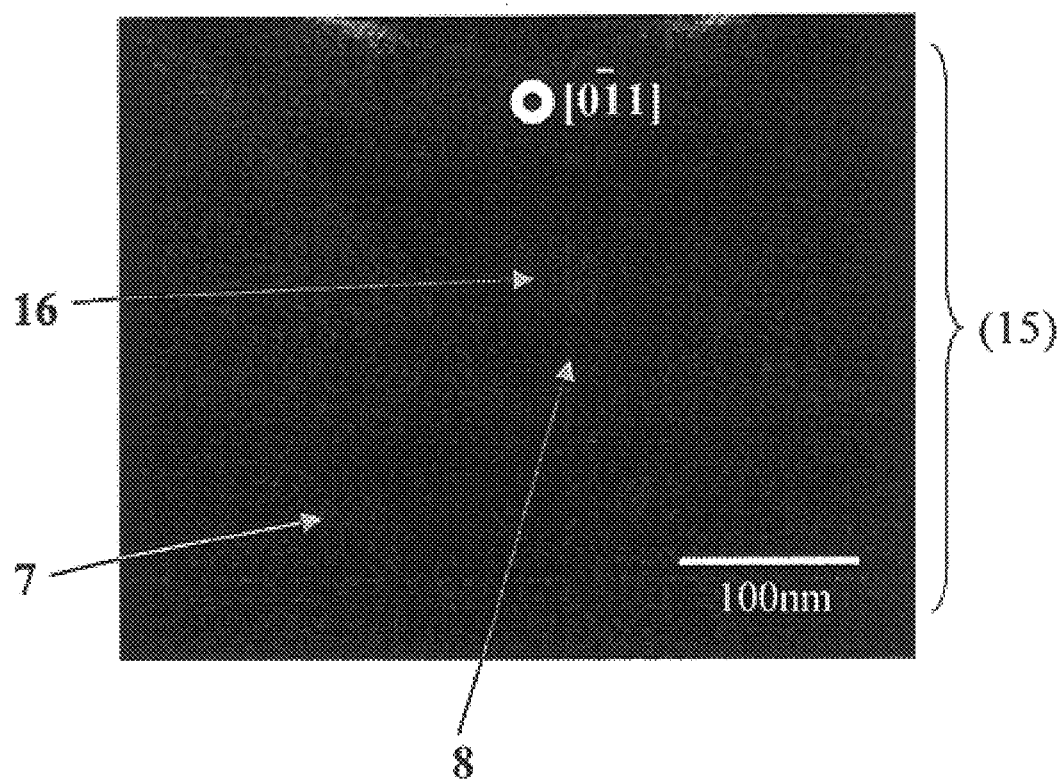
FIG. 4 is an enlarged photograph of the top region shown in FIG. 3.

FIG. 4 is an enlarged photograph of the top region shown in FIG. 3, which shows a cross-section of quantum wires (16) formed when GaAs (7)/AlGaAs (8) layers are overgrown in the form of a quantum well. It can be clearly seen from FIG. 4 that the quantum wires (16) were formed in a V-groove. Here, an AlGaAs layer (8) and a GaAs layer (7) were grown alternatively, and the AlGaAs layer (8) was 300 Å or more in thickness, and the GaAs layer (7) was of 300 Å or less in thickness.

Figure 5:
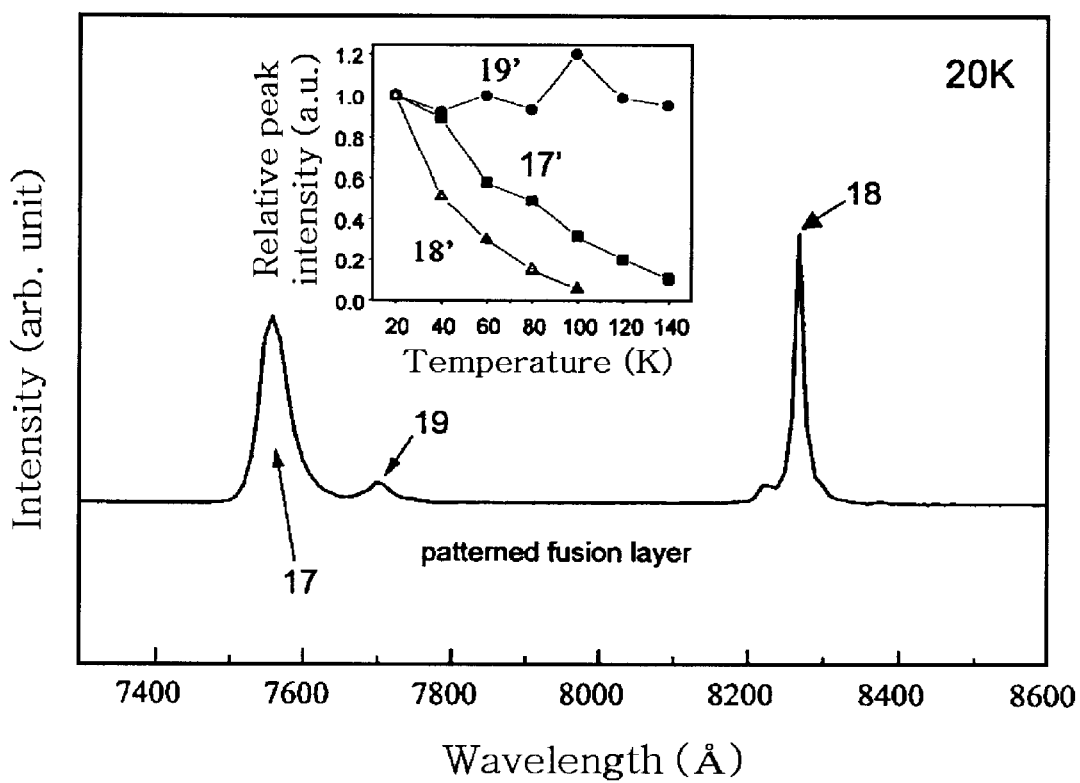
FIG. 5 is a graph illustrating the photoluminescence spectra signal measured on the top region shown in FIG. 4.

FIG. 5 is a graph illustrating the photoluminescence spectra signal measured on the top region shown in FIG. 4. It can be seen from FIG. 5 that the signals (17, 18) of the quantum well, the GaAs layer and the signal (19) of the quantum wire are clearly exhibited. The signal (19) of the quantum wire can be observed only by forming a good quality quantum structure. The experimental results of the temperature change illustrated at the top of FIG. 5 show that the typical behavior (19') of the quantum wire is different from the behavior (17') of a quantum well or that (18') of the GaAs layer. Therefore, the new possibility that quantum structures such as quantum wires and dots can be grown between semiconductor material with a large lattice mismatch is substantiated by the present invention.

According to the present invention, a high quality heteroepilayer can be formed by patterning a fused semiconductor layer, overgrowing it with a persistent patterned character, and fusing other semiconductors having different lattice constants by means of utilizing the rate difference between the lateral growth rate and the vertical growth rate exhibited in the above process. Further, according to the present invention, the lattice constant difference of the two semiconductors can be overcome and a high quality quantum structure can be formed. The present invention is a specific technique whereby a quantum structure is formed by growth on a fusion layer patterned V or U-groove. By such a technique, the growth of semiconductors having a large lattice constant difference can be carried out easily, thereby creating the base material from which the new, as yet on realized, conceptive optoelectronic devices can be made.

What is claimed is:

1. A method of fusion for heteroepitaxial layers and overgrowth comprising the steps of:

a) forming a first epitaxial layer on a first semiconductor substrate, the first epitaxial layer having a lattice constant similar to that of the first semiconductor substrate, and the first epitaxial layer formed as a sacrificial layer on the first semiconductor substrate;

b) forming a second epitaxial layer made of the same material as that of said first semiconductor substrate, as a fusion layer on said sacrificial layer;

c) fusing said fusion layer to a second semiconductor substrate consisting of a material having a lattice constant different from said first semiconductor substrate;

d) separating said first semiconductor substrate from said second semi-conductor substrate by removing said sacrificial layer;

e) patterning a U or V shape in the fusion layer; and f) overgrowing multi-layers on said patterned fusion layer, said multi-layers made of materials having lattice constants that are the same as or similar to that of said fusion layer; wherein said first semiconductor substrate material and said second semiconductor substrate material are selected from the group consisting of $In_xGa_{1-x}As_yP_{1-y}$ and GaAs, $In_xGa_{1-x}Sb$ and GaAs, $In_xGa_{1-x}As$ and Si, and $Si_{1-x}Ge_x$ and Si.

2. The method according to claim 1, wherein, in the step e) of patterning on said fusion layer, the cross section width of the patterned fusion layer ranges from 50 mm to 10 μm.

3. The method according to claim 1, the step c) of fusing the fusion layer on said second semiconductor substrate is carried out by a process comprising:

contacting the surface of the fusion layer with the surface of the second semiconductor substrate;

maintaining said substrates in this state at a temperature of 200–950° C. and a pressure of 0–100 atm under $H_2$ ambient or vacuum for 10 min–5 hours; and lowering the temperature and releasing the pressure.

* * * * *